(12) United States Patent
Conway et al.

(10) Patent No.: US 7,961,995 B2
(45) Date of Patent: Jun. 14, 2011

(54) ELECTRICALLY TUNABLE PLASMON LIGHT TUNNELING JUNCTION

(75) Inventors: Josh A. Conway, Redondo Beach, CA (US); Andrew D. Stapleton, South Pasadena, CA (US)

(73) Assignee: The Aerospace Corporation, El Segundo, CA (US)

( * ) Notice: Subject to any disclaimer, the term of this patent is extended or adjusted under 35 U.S.C. 154(b) by 246 days.

(21) Appl. No.: 12/283,802

(22) Filed: Sep. 16, 2008

(65) Prior Publication Data

US 2010/0066238 A1  Mar. 18, 2010

(51) Int. Cl.
*G02B 6/26* (2006.01)
*G02B 6/10* (2006.01)
*G02F 1/035* (2006.01)

(52) U.S. Cl. .................. 385/39; 385/2; 385/30; 385/31; 385/130

(58) Field of Classification Search .................. None
See application file for complete search history.

(56) References Cited

U.S. PATENT DOCUMENTS

| | | | |
|---|---|---|---|
| 4,163,902 A | | 8/1979 | Lambe et al. |
| 6,034,809 A | * | 3/2000 | Anemogiannis ............... 359/254 |
| 6,563,185 B2 | * | 5/2003 | Moddel et al. ................ 257/425 |
| 7,010,183 B2 | | 3/2006 | Estes et al. |
| 7,177,515 B2 | | 2/2007 | Estes et al. |
| 7,732,786 B2 | * | 6/2010 | Gorrell et al. ................ 250/397 |
| 2003/0059147 A1 | * | 3/2003 | Berini ............................. 385/2 |
| 2003/0206708 A1 | * | 11/2003 | Estes et al. ..................... 385/130 |
| 2008/0272302 A1 | * | 11/2008 | Frey et al. .................... 250/336.2 |
| 2009/0052827 A1 | * | 2/2009 | Durfee et al. ..................... 385/2 |

OTHER PUBLICATIONS

J. Lambe et al., "Light Emission from Inelastic Electron Tunneling", Physical Review Letters, vol. 37, No. 14, pp. 923-925, 1976.
L. C. Davis ,"Theory of Surface-Plasmon Excitation in Metal-Insulator-Metal Tunnel Junctions," Physical Review B, vol. 16, No. 6, pp. 2482-2490, 1977.
Josh A. Conway ,"Efficient Optical Coupling to the Nanoscale," Doctoral Dissertation, UCLA, 2006.

* cited by examiner

Primary Examiner — Tina M Wong
(74) Attorney, Agent, or Firm — K &L Gates LLP

(57) ABSTRACT

An electrically modulated plasmonic junction generates surface plasmons from an electrical signal from an electrical source, with the tunnel junction having a contact with a tapered end forming the junction in a gap between the contact and a substrate, with the gap serving to translate electrical signals into surface plasmons that are in turn translated into emitted photons communicated externally through a transmissive oxide, so that the junction can function as an electrically controlled light emitter preferably built as a nano-scale broadband optical emitter whose output wavelength can be electrically tuned over hundreds of nanometers, can be directly modulated at high speeds, and can have improved efficiencies compared to standard silicon optical sources, and the junction can also operate in a reserve mode for light detection.

22 Claims, 1 Drawing Sheet

Plasmonic Tunneling Junction

Plasmonic Tunneling Junction

ELECTRICALLY TUNABLE PLASMON LIGHT TUNNELING JUNCTION

FIELD OF THE INVENTION

The invention relates to the field of Plasmon Devices. More particularly, the present invention relates to plasmon junctions for generating light.

BACKGROUND OF THE INVENTION

Directly modulated light emitting diodes are limited to relatively low modulation bandwidths. This is because the spontaneous optical emission is limited by the recombination lifetime of the injected minority carriers, which is generally greater than ins. Although theory predicts that this lifetime can be decreased through Purcell enhancement, no such demonstration has shown a speed more than an order of magnitude in the visible spectrum. Semiconductor laser diodes can achieve higher modulation bandwidths because of the speed of stimulated emission, and the laser diodes tend to be limited by the interplay of many factors including an RC rise time, photon lifetime, and the gain dynamics of the material. Through years of engineering advances, commercial laser diode sources have achieved direct modulation bandwidths of approximately 10 Gb/s. Because of this limitation, costly arrays of laser diodes, drivers, external modulators, and wavelength division multiplexing optics are used for requisite data rates. Thus, the telecom market has a serious need for a directly modulated optical source with modulation bandwidths beyond the current 10 Gb/s limit.

In addition to the need for high-speed direct modulation, other emerging applications in spectroscopy and lab-on-a-chip designs require broadband and tunable optical sources for metrology applications. Again, laser diodes and light emitting diodes fall short, with tunable bandwidths typically on the order of 50 nm at most. There is demand for an optical source, which can be tuned over hundreds of nanometers with a simple electrical drive and without moving parts.

In addition, there is a need for very small optical sources. The rapid growth in demand for optical communication capabilities has created a renewed interest in nano-scale optical sources. The compelling need for compact, high-speed communications between cores at the chip and board level further punctuates the need for integrated optical sources and modulators. Creating an optical emitter with the functionality to be modulated at greater than 100 GHz frequencies will revolutionize electronic devices and data communications systems. However, generating light in silicon has proven to be very difficult. Because silicon is an indirect bandgap semiconductor, band-to-band, electron-hole radiative recombination is inefficient. For this reason, light sources for optoelectronic systems are typically implemented using direct-bandgap compound semiconductor devices with quantum well or quantum dot active regions that provide the optical gain necessary for laser operation. These sources are off-chip, made from non-CMOS materials, and have size scales that are several orders of magnitude larger than the transistor. Integrating compound semiconductor light sources with silicon photonic and microelectronic systems is complicated and costly.

Approaches for light emission in silicon have been proposed and include silicon nanocrystals as taught by Pavesi, L., et al., in "Optical gain in silicon nanocrystals", Nature, vol. 408, 440-444, 2000, include Si/SiO$_2$ superlattices as taught by D. J. Lockwood, et al., in "Quantum confined luminescence in Si/SiO$_2$ superlattices", Phys. Rev. Lett., vol. 76, 539-541, 1996, include doping with active impurities, such as erbium, as taught by H. S. Han, et al. in "Optical Gain at 1.54 μm in Erbium-doped Nanocluster Sensitized Waveguide" Appl. Phys. Lett., vol. 79, 4568-4570, 2001, and include stimulated Raman scattering as taught by R. D. Claps, et al., in "Observation of Raman Emission in Silicon Waveguides at 1.54 μm", Opt. Express, vol. 10, 1305-1313, 2002. These demonstrations were all accomplished with optical excitation from an external light source and may not be suitable for efficient on-chip light emission. Porous silicon light emitting diodes that might be suitable for on-chip integration with electronics have been demonstrated as taught by P. Fauchet, in "The integration of Nanoscale Porous Silicon Light Emitters" in Jour. of Luminescence, vol. 80, 53-64, 1999. But, the direct electrical to optical conversion efficiency of these devices is at best a fraction of 1.0% as taught by H. Wong et al., in "Silicon Integrated Photonics Begins to Revolutionize." Microelectronics Reliability, vol. 47, 1-10, 2007.

A first experimental demonstration of light emission due to inelastic electron tunneling was taught by J. Lambe et al., in "Light Emission from Inelastic Electron Tunneling", Physical Review Letters, vol. 37, no. 14, pp. 923-925, 1976. In their original device, a millimeter-sized square of Aluminum was oxidized, creating 3 nm of alumina oxide. A counter electrode of silver and gold was then electron-beam evaporated on top of the alumina, creating a metal-insulator-metal structure. The insulator is sufficiently thin to allow for non-negligible tunnel current across the gap. When voltage was applied across the electrodes, visible light was emitted from the device, with a cut-off such that $hf_p = eV$, where h is Plank's constant, $f_p$ is the cut-off frequency, e is the electron charge, and V is the applied voltage. This optical emission was broadband, highly incoherent, and not very directional, much like an incandescent source, such as a light bulb. It appears that simply changing the voltage changed the color of the emission, thus, there was the creation of a solid-state and very broad-band tunable emitter with threshold voltages on the order of 1V. While this was a step forward for optical devices, the problems lie in the efficiency of the device, which was estimated at one collected photon for every $10^5$ electrons of current. Because of this severe performance limitation, the devices are deemed practically unsuitable for commercial exploitation. As suggested in the original work, and as theoretically shown in a subsequent publication by L. C. Davis as taught in "Theory of Surface-Plasmon Excitation in Metal-Insulator-Metal Tunnel Junctions," Physical Review B, vol. 16, no. 6, pp. 2482-2490, 1977, the mechanism of optical generation in the junction is inelastic electron tunneling, which is the physical principle behind conversion of tunnel current into light.

As the electron tunnels through the insulator, the electronics create an optical excitation through this scattering process. This is to be contrasted with electron injection, in which the high energy electron would tunnel across the barrier and spontaneously decay to the thermal level through optical emission. In the inelastic tunneling process, it has been shown that the efficiency at optical frequencies is on the order of 10% and no free space optical modes can fit into a 3 nm spacing. As an application of Maxwell's equations will show, the only available optical modes are surface plasmon resonances in this structure. It was the surface plasmon resonances that caused the inefficiency of the device. Surface plasmon modes in such a structure have propagation lengths on the order of tens of nanometers, and hence, a good deal of the optical excitation was immediately lost to absorption via Joule heating. For the metal-insulator-metal geometry consisting of a 2 mm$^2$ device area having a bottom aluminum layer, a middle aluminum oxide insulating $Al_2O_3$ layer, and a top silver layer, only plasmons that are able to evanescently tunnel through the top contact and scatter from surface roughness can become free space light. The optical modes experience a large impedance mismatch as well as the mode-size mismatch. Thus, the device does not have a well-designed plasmonic out-coupling means to achieve improved efficiency.

While the physical control of nanostructures was beyond the reach of earlier fabrication techniques, modern technology makes such plasmonic out-coupling entirely possible. A doctoral dissertation of Josh A. Conway was on the subject of efficient optical coupling to a nano-scale gap as taught in "Efficient Optical Coupling to the Nanoscale," Doctoral Dissertation, UCLA, 2006. In this work, it was found that electromagnetic energy could be coupled from a free-space field into a metal-insulator-metal volume of tens of nanometers with improved efficiency. However, a 35 dB of loss is encountered using 90 degree angles of a silver contact relative to the aluminum oxide and aluminum substrate.

Another key aspect of inelastic electron tunneling is its speed. This is exemplified by the large 1 eV optical bandwidth. From Heisenberg's Uncertainty Principle, it is known that such large bandwidths mean that the inelastic tunneling is a tremendously fast process, on the order of $10^{-15} s = 1$ fs. Conventional light emitting diodes are principally limited by the lifetime of the injected minority carriers as taught by B. E. A. Saleh et al., Fundamentals of Photonics, p. 606, John Wiley and Sons, New York, 1991. The lifetime of injected minority carriers tend to be on the order of ins to 50 ns. This means that the inelastic tunnel junction has a fundamental modulation limit, which is five orders of magnitude faster than the standard art. However, the velocity of an electron on the Fermi surface is $1.4 \times 10^6$ m/s for both Ag and Au as taught by C. Kittel in "Introduction to Solid State Physics", p 150, John Wiley and Sons, New York, Seventh Edition, 1996. The thickness of the gap is on the order of 1 nm=$10^{-9}$ m. As such, the expected speed of an electron tunneling across the gap to be on the order of $10^{-15}$ s, which is 1 fs. This rapid process, then, enables extremely fast and directly modulated optical source, unlike any conventional emitter.

The prior art includes U.S. Pat. No. 4,163,920 entitled "Solid State Source of Radiant Energy having a Controllable Frequency Spectra Characteristic", by Lambe et al., issued Aug. 7, 1979, U.S. Pat. No. 7,010,183, entitled "Surface Plasmon Devices", by Estes, et al., issued Mar. 7, 2006, and U.S. Pat. No. 7,177,515 entitled "Surface Plasmon Devices", by Estes, et al., issued Feb. 13, 2007. All of these devices use large area structures to generate plasmons in the tunnel junction. By the fundamental laws of causality, these devices are far too inefficient to ever be useful. These and other disadvantages are solved or reduced using the invention.

SUMMARY OF THE INVENTION

An object of the invention is to provide a plasmonic tunneling junction that is electrically modulated.

Another object of the invention is to provide an electrically modulated plasmonic tunneling junction for generating surface plasmons.

Yet another object of the invention is to provide an electrically modulated plasmonic tunneling junction for generating surface plasmons coupled as emitted photons.

Still another object of the invention is to provide an electrically modulated plasmonic tunneling junction for generating surface plasmons coupled externally as emitted photons.

Still another object of the invention is to provide an electrically modulated plasmonic tunneling junction for generating surface plasmons coupled externally as emitted photons using a tapered contact relative to a substrate and a gap disposed between the contact and the substrate.

A further object of the invention is to provide an electrically modulated plasmonic tunneling junction for generating surface plasmons coupled externally as emitted photons coupled by coupling grating into external waveguides for guiding plasmonic generating guided light.

Yet a further object of the invention is to provide an electrically modulated plasmonic tunneling junction for generating surface plasmons coupled externally as emitted photons using internal reflecting gratings for efficient coupling of generated plasmons into the emitted photons.

The invention is directed to a plasmonic tunneling junction for providing emitted light. The junction can be made into a nano-scale broadband optical emitter having an output wavelength that can be electrically tuned over hundreds of nanometers, can be directly modulated at high speeds, and can have improved efficiencies. This improvement in efficiency is enabled by the tapered design of an electrical contact relative to the substrate. The junction functions as an efficient light source with an improved electrical to optical conversion efficiency. The junction can enhance the capabilities of chip-scale optical communications technology and may ultimately be a deciding factor in monolithic integration of optical and electronic circuits. The junction relies on a small area tunneling gap region with an adiabatic taper of the contact to couple the light to large area modes offering efficient plasmonic light generation.

The junction can be electrically pumped and operate as a nano-scale modulated light emitter. The junction may include a metal-insulator-metal plasmonic structure with a nano-scale tunnel junction at the focus point. The tapering of the contact provides for surface plasmon generation that can be translated into emitted photons at a taper edge. The surface plasmons can be reflected back toward the gap by plasmonic Bragg gratings for improved efficiency and directionality. The plasmonic radiation is generated at this tunnel junction in the gap by inelastic electron tunneling. The surface plasmons then efficiently couple to free-space or guided wave optical radiation as surface plasmons propagate across the adiabatic taper. The peak emission wavelength can be electrically tuned by simply changing the bias voltage of an external electrical source. Because the junction operates through inelastic electron tunneling across an insulating gap, the junction can be constructed with materials compatible with conventional CMOS processes. The tunneling mechanism also has the additional advantage of being extremely fast. This suggests that these emitters can be directly modulated at speeds well above 100 GHz. These and other advantages will become more apparent from the following detailed description of the preferred embodiment.

DETAILED DESCRIPTION OF THE PREFERRED EMBODIMENT

Figure 1:
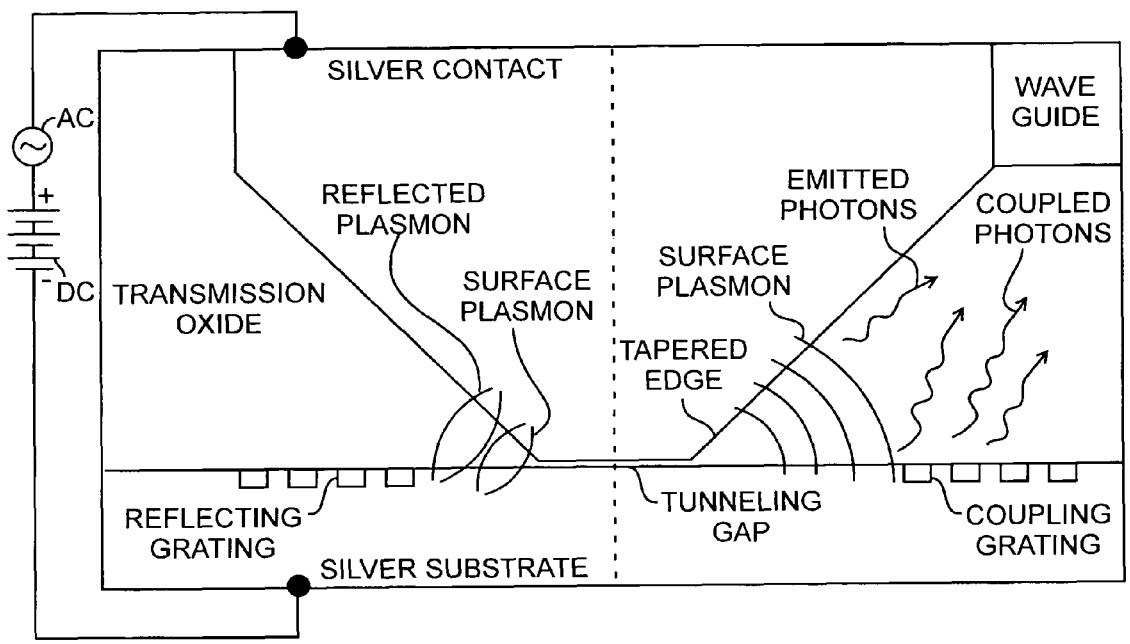
FIG. 1 is a drawing of a plasmonic tunneling Junction.

An embodiment of the invention is described with reference to the figures using reference designations as shown in the drawing. Referring to the drawing, a plasmonic tunneling junction includes a top silver contact, a middle tunneling gap, and a bottom silver substrate. The gap is disposed between the contact and substrate. The gap is planar and is disposed between a top planar surface of the substrate and a bottom planar surface of the contact. The gap is formed from an insulating oxide, such as aluminum oxide. This insulating oxide also extends from the gap to exterior surfaces of the tapered contact on either side of the junction to function as an optical waveguide. Surface plasmons are generated at the gap and propagate outwardly toward and through the transmission oxide. The contact is tapered toward the bottom of the contact so that the contact narrows at the gap. The contact and gap are preferably circular, the gap being defined as a disc of oxide between the tapered contact and the substrate. Hence, the contact is preferably a cylinder at the electrical connection end and nearly in the shape of a cone at the gap end where the contact gap end forms a disc shaped surface. As such, the contact would have a large top portion to which is connected an electrical source that may include a DC voltage level for bias and an AC voltage level for modulation, which electrical source is also grounded to the substrate. The plasmonic tunneling junction may include other features for guiding and coupling the surface plasmons and the emitted light.

The surface plasmons radiate in all 360° planar directions away from the disc shaped gap outwardly toward external surfaces of the junction and along the substrate surface and tapered surface of the contact. However, desired modulated emitted light may be guided in specific directions. Also, surface plasmons may be guided for improved efficiency and directionality. For example, surface plasmons generated in undesirable directions may be reflected so that the energy of these reflected plasmons are again used to emit plasmons in a desired direction. As such, and by way of examples, the silver substrate may include reflective gratings that reflect surface plasmons back toward the gap. This can thus create a cavity enhancing emission in the preferred direction through a stimulated emission.

Some of the surface plasmons may be generated in the desired direction and become emitted photons passing through the transmission oxide toward the exterior surface of the junction for emission. The transmission oxide can be shaped for improved directionality of the emitted photons. Further still, the substrate, as well as the contact on the tapered edge can have a coupling grating for improved coupling of the surface plasmons into the emitted light as coupled photons. Further still, an optical waveguide can be integrated with the junction for improved guiding and directionality of the emitted light.

Out-coupling the plasmon field from the junction into free space is where the surface plasmons are coupled from the short-propagation length modes in the tunnel gap to long range plasmons as the plasmons move across the taper region. The surface plasmons are then coupled as free-space emitted or coupled photons through the use of grating structures. From there, the free-space coupled photons can be guided to spectroscopic or communication applications through conventional means.

There are many other grating, guiding, and focusing means that can be used for removing light from or to the taper, which does not require out coupling to free-space photons. For most data communication applications, it is desirable to keep the light in a guided mode. A taper only on a portion of the contact may focus emitted photons directly into a dielectric and metal waveguide. In this instance, the plasmons are in a higher index medium than the surrounding dielectric matrix. The emitted photons are thus confined through total internal reflection at the waveguide interface, leading to directional output and increasing the waveguide collection efficiency.

The increase in emission efficiency lies in the physical principles behind the conversion of tunnel current into light. The junction has a tapered metal-insulator-metal geometry, which terminates in a gap thickness on the order of 1 nm. The junction is preferably cylindrically symmetric, and thus, the taper acts as a dimple lens when compressing plasmonic optical fields to such small dimensions. Efficiencies of greater than 50% can be achieved for taper angles from 15 degrees to 40 degrees, although the exact angle of the taper is material and frequency dependent. The reciprocity of the single-mode focusing of the plasmons offers high efficiency when operated in reverse. Thus, the junction can be used as an optical detector having electrical bandwidth selectively. The tapered contact and disc gap shape can be used for both emission and detection of optical light. A DC bias voltage can be applied across the gap for creating plasmons, which efficiently coupled to large area plasmons, which have long propagation lengths and are easily coupled to free-space optical waves.

While the junction is described as a light generation device, the junction could be used to detect external light. External light can be received through the waveguide that directs communicated light toward the tapered edge. The tapered end of the contact, the gap, and the substrate collectively function to translate the received light as received photons into surface plasmons that are coupled into the junction as electrical signals. The DC and AC electrical source can be an electrical detector for detecting the presence of external light, in a reverse operation. In this manner, the junction cannot only generate light from the electrical source as a modulated transmitter, but can also act as a light detector.

The exploitation of the junction covers a very broad range of applications and technologies. Most notably, the junction could resolve the ongoing problems of integrating an optical source for board and chip level communications. Unlike conventional optical emitters, which are lower bounded in size to be on the order of an optical wavelength, the plasmonic tunneling junction is a device that can directly output highly subwavelength surface plasmons. The junction also can be made small with dimensions compatible with conventional transistors in the 10 nm to 100 nm range. The junction can be used to solve the problems of chip and board level optical communications. The junction can be used for short communications links. The junction can generate optical emissions over a broad range of frequencies, from the infrared to the ultraviolet. Thus, the junction offers many applications, from a lab-on-a-chip, to biomedical diagnostics, and to phototherapy. Those skilled in the art can make enhancements, improvements, and modifications to the invention, and these enhancements, improvements, and modifications may nonetheless fall within the spirit and scope of the following claims.

What is claimed is:

1. A plasmonic tunneling junction for communicating light, the junction comprising,
   a metallic contact having a top portion and a lower circular portion, and a conically tapered portion extending from the top portion to the lower circular portion,
   a metallic substrate having a top portion, wherein a gap is formed between the lower circular portion of the metallic contact and the top portion of the metallic substrate for conversion between electrical signals and surface plasmons, and
   an insulator disposed in the gap and extending from the gap adjacent to the conically tapered portion of the metallic contact, wherein the insulator is for coupling out the light as communicated photons, the electrical signals being across the metallic contact and the metallic substrate for generating the surface plasmons at the gap, the surface plasmons translating into the communicated photon along the conically tapered portion of the metallic contact.

2. The junction of claim 1 being connected to an electrical source wherein,
the electrical source is connected between the contact and the substrate for providing the electrical signals across the gap.

3. The junction of claim 1 wherein,
the contact is a silver contact,
the substrate is a silver substrate, and
the insulator is an optically transparent material.

4. The junction of claim 1 further comprising,
reflecting gratings embedded in the substrate for reflecting the surface plasmons toward the gap.

5. The junction of claim 1 further comprising,
coupling gratings embedded in the substrate for coupling the surface plasmons into coupled photons becoming the communicated light.

6. The junction of claim 1 further comprising,
a waveguide for guiding the communicated light toward an external surface of the junction.

7. The junction of claim 1 wherein,
the conically tapered portion of the contact is tapered relative to the substrate at an angle between 15 to 40 degrees.

8. The junction of claim 1 being connected to an electrical source wherein,
the electrical source is connected between the contact and the substrate for providing the electrical signals,
the electrical source comprising DC bias across the gap, and
the electrical source comprising AC modulation across the gap.

9. A plasmonic tunneling junction for communicating light from an external light source, the junction comprising,
a metallic contact having a top portion and a lower circular portion, and a conically tapered portion extending from the top portion to the lower circular portion,
a metallic substrate having a top portion, wherein a gap is formed between the lower circular portion of the metallic contact and the top portion of the metallic substrate for conversion between electrical signals and surface plasmons, and
an insulator disposed in the gap and extending from the gap adjacent to the conically tapered portion of the metallic contact, wherein the insulator is for receiving light from the external light source as received photons, the metallic contact and metallic substrate for detecting surface plasmons at the gap, the conically tapered portion of the metallic contact for translating the received light into the surface plasmons, the junction for translating the surface plasmons into electrical signals.

10. The junction of claim 9 being connected to an electrical detector, wherein,
an electrical detector is connected between the contact and the substrate for detecting the electrical signals across the gap.

11. The junction of claim 9 wherein,
the contact is a silver contact,
the substrate is a silver substrate, and
the insulator is an optically transparent material.

12. The junction of claim 9 being connected to an electrical detector, wherein,
an electrical detector is connected between the contact and the substrate for detecting the electrical signals and for providing a DC bias across the gap.

13. A plasmonic tunneling junction for communicating light, the junction comprising,
a contact having a tapered edge defining a tapered end,
a substrate having a top portion,
a gap formed between the tapered end and the top portion for conversion between electrical signals and surface plasmons, and
an insulator extending from the gap for coupling out the light as communicated photons, the electrical signals being across the contact and the substrate for generating the surface plasmons at the gap, the surface plasmons translating into the communicated photon along the taper,
wherein the contact is a silver contact, the substrate is a silver substrate and the insulator is an optically transparent material.

14. The junction of claim 13 being connected to an electrical source wherein,
the electrical source is connected between the contact and the substrate for providing the electrical signals across the gap.

15. The junction of claim 13 further comprising,
reflecting gratings embedded in the substrate for reflecting the surface plasmons toward the gap.

16. The junction of claim 13 further comprising,
coupling gratings embedded in the substrate for coupling the surface plasmons into coupled photons becoming the communicated light.

17. The junction of claim 13 further comprising,
a waveguide for guiding the communicated light toward an external surface of the junction.

18. The junction of claim 13 wherein,
the tapered end of the contact is tapered relative to the substrate at an angle between 15 to 40 degrees.

19. The junction of claim 13 being connected to an electrical source wherein,
the electrical source is connected between the contact and the substrate for providing the electrical signals,
the electrical source comprising DC bias across the gap, and
the electrical source comprising AC modulation across the gap.

20. A plasmonic tunneling junction for communicating light from an external light source, the junction comprising,
a contact having a tapered edge defining a tapered end,
a substrate having a top portion,
a gap formed between the tapered end and the top portion for conversion between electrical signals from surface plasmons, and
an insulator extending from the gap for receiving light from the external light source as received photons, the contact and substrate for detecting surface plasmons at the gap, the taper for translating the received light into the surface plasmons, the junction for translating the surface plasmons into electrical signals,
wherein the contact is a silver contact, the substrate is a silver substrate and the insulator is an optically transparent material.

21. The junction of claim 20 being connected to an electrical detector, wherein,
an electrical detector is connected between the contact and the substrate for detecting the electrical signals across the gap.

22. The junction of claim 20 being connected to an electrical detector, wherein,
an electrical detector is connected between the contact and the substrate for detecting the electrical signals and for providing a DC bias across the gap.

* * * * *